United States Patent
Benjamín

(10) Patent No.: US 9,543,434 B2
(45) Date of Patent: Jan. 10, 2017

(54) DEVICE ACTIVE CHANNEL LENGTH/WIDTH GREATER THAN CHANNEL LENGTH/WIDTH

(75) Inventor: Trudy Benjamín, Portland, OR (US)

(73) Assignee: HEWLETT-PACKARD DEVELOPMENT COMPANY, L.P., Houston, TX (US)

( * ) Notice: Subject to any disclaimer, the term of this patent is extended or adjusted under 35 U.S.C. 154(b) by 56 days.

(21) Appl. No.: 14/112,627

(22) PCT Filed: May 19, 2011

(86) PCT No.: PCT/US2011/037202
§ 371 (c)(1),
(2), (4) Date: Oct. 18, 2013

(87) PCT Pub. No.: WO2012/158174
PCT Pub. Date: Nov. 22, 2012

(65) Prior Publication Data
US 2014/0042505 A1    Feb. 13, 2014

(51) Int. Cl.
*H01L 29/78*     (2006.01)
*H01L 21/8234*   (2006.01)
*H01L 27/088*    (2006.01)
*H01L 29/66*     (2006.01)

(52) U.S. Cl.
CPC ..... *H01L 29/783* (2013.01); *H01L 21/823425* (2013.01); *H01L 21/823456* (2013.01); *H01L 21/823468* (2013.01); *H01L 27/088* (2013.01); *H01L 29/66477* (2013.01); *H01L 29/66568* (2013.01); *H01L 29/78* (2013.01)

(58) Field of Classification Search
CPC ............... H01L 29/6659; H01L 29/66772
USPC .................................. 257/288; 438/284
See application file for complete search history.

(56) References Cited

U.S. PATENT DOCUMENTS

| | | | | |
|---|---|---|---|---|
| 5,156,989 A | * | 10/1992 | Williams et al. | 438/206 |
| 5,258,636 A | * | 11/1993 | Rumennik et al. | 257/339 |
| 5,811,863 A | * | 9/1998 | Rostoker et al. | 257/401 |
| 6,049,104 A | | 4/2000 | Hshieh et al. | |
| 6,773,997 B2 | | 8/2004 | Imam et al. | |
| 7,196,375 B2 | | 3/2007 | Chen et al. | |
| 7,808,057 B2 | | 10/2010 | Lee | |
| 2006/0019488 A1 | | 1/2006 | Liaw | |
| 2008/0237704 A1 | | 10/2008 | Williams et al. | |
| 2008/0246062 A1 | | 10/2008 | Brauer et al. | |
| 2009/0081836 A1 | | 3/2009 | Liu et al. | |
| 2009/0101990 A1 | | 4/2009 | Kang et al. | |
| 2009/0108348 A1 | * | 4/2009 | Yang | H01L 21/28123 257/345 |
| 2012/0049292 A1 | * | 3/2012 | Ueda | H01L 21/82341 257/390 |
| 2014/0103440 A1 | * | 4/2014 | Chatterjee | H01L 21/28123 257/368 |

* cited by examiner

*Primary Examiner* — Fernando L Toledo
*Assistant Examiner* — Neil Prasad
(74) *Attorney, Agent, or Firm* — Dicke, Billig & Czaja PLLC

(57) ABSTRACT

A device including a drain, a channel, and a gate. The channel surrounds the drain and has a channel length to width ratio. The gate is situated over the channel to provide an active channel region that has an active channel region length to width ratio that is greater than the channel length to width ratio.

14 Claims, 7 Drawing Sheets

DEVICE ACTIVE CHANNEL LENGTH/WIDTH GREATER THAN CHANNEL LENGTH/WIDTH

BACKGROUND

Integrated circuits include analog and digital circuits made up of circuit components, such as transistors, diodes, and resistors. Sometimes, the function of one component is provided by another component, such as when transistors are configured to provide the function of a diode or a resistor.

In some logic circuits, referred to as ratioed logic circuits, resistors are connected as loads to transistors. In a ratioed logic circuit inverter, a resistive pull-up is connected to a transistor pull-down. The resistance value of the resistive pull-up is chosen to provide a low output voltage in one logic state and to charge the output to a high output voltage in the other logic state. A higher resistance value provides a lower output voltage and reduces power consumption.

In some semiconductor processes, providing a resistor with a higher resistance value consumes a large amount of valuable real estate on the integrated circuit chip. To reduce the amount of real estate used, the resistor function can be provided with a transistor, such as by connecting the drain of a metal-oxide-semiconductor field-effect-transistor (MOSFET) to its gate. In some processes, providing a higher resistance value with a drain-to-gate connected MOSFET is difficult.

DETAILED DESCRIPTION

In the following detailed description, reference is made to the accompanying drawings which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
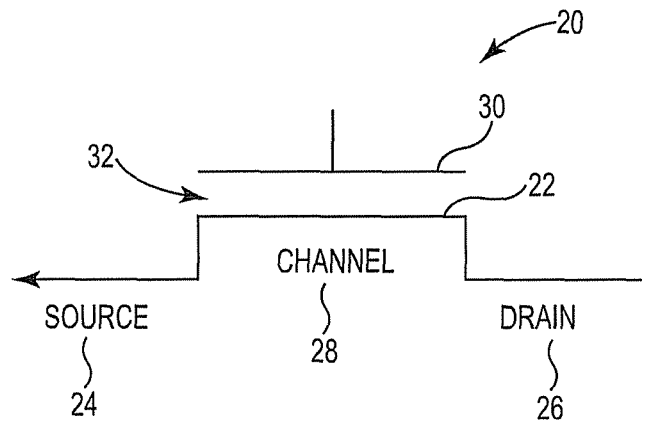
FIG. 1 is a diagram illustrating one example of a MOSFET.

FIG. 1 is a diagram illustrating one example of a MOSFET 20 that includes a semiconductor substrate 22 having a source 24, a drain 26, and a channel 28. The channel 28 is situated between source 24 and drain 26, and a gate 30 is situated over channel 28. A layer of dielectric material 32 is disposed between channel 28 and gate 30. Source 24 includes an N+ doped region and drain 26 includes an N+ doped region. Channel 28 includes a p doped region situated between the N+ doped regions of source 24 and drain 26.

In operation, a voltage is applied to gate 30 to create a conductive path in channel 28 between drain 26 and source 24. With drain 26 connected to a higher voltage and source 24 connected to a lower voltage, such as ground, current flows from drain 26 to source 24. A lower voltage at gate 30 biases MOSFET 20 toward the off state, where current does not flow between drain 26 and source 24.

Figure 2:
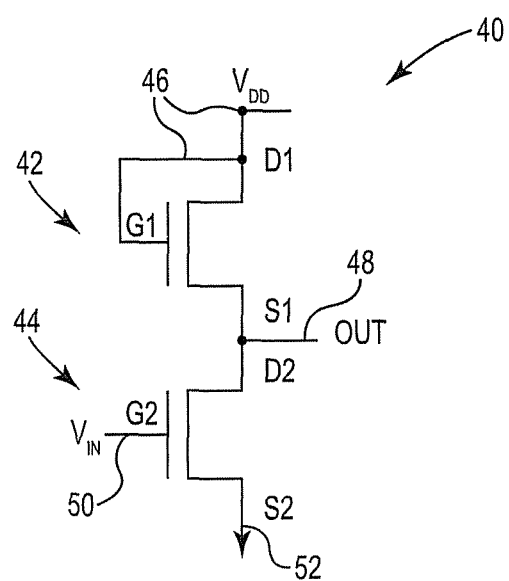
FIG. 2 is a diagram illustrating one example of a ratioed logic circuit inverter.

In ratioed logic circuits, a transistor such as MOSFET 20 can be used as a transistor or to provide the function of a resistor. To provide the function of a resistor, drain 26 is electrically coupled to gate 30. If a higher voltage is provided at drain 26 and gate 30 than at source 24, current flows from drain 26 to source 24. FIG. 2 is a diagram illustrating one example of a ratioed logic circuit inverter 40 that includes a first transistor 42 and a second transistor 44. Each of the first and second transistors 42 and 44 is similar to MOSFET 20. In another example, first transistor 42 is similar to MOSFET 20 and second transistor 44 is a different type of transistor.

First transistor 42 functions as a resistive pull-up and second transistor 44 functions as a transistor pull-down. The drain D1 of first transistor 42 is electrically coupled to the gate G1 of first transistor 42 and to VDD at 46. The source S1 of first transistor 42 is electrically coupled to the drain D2 of second transistor 44 and to output OUT at 48. The gate G2 of second transistor 44 receives an input voltage VIN at 50 and the source S2 of second transistor 44 is electrically coupled to a reference at 52, such as ground.

In operation, a low input voltage VIN at 50 biases second transistor 44 off. First transistor 42 functions as a resistive pull-up to pull output OUT at 48 to a high voltage value that approaches VDD. A high input voltage VIN at 50 biases second transistor 44 on, which pulls output OUT at 48 to a low output voltage. This low output voltage is substantially equal to VDD times the ratio of the on-resistance of second transistor 44 to the summed resistances of first transistor 42 and the on-resistance of second transistor 44. First transistor 42 is built to provide a resistance value that provides a low output voltage below the threshold voltage of the next logic stage. Higher resistance values provided by first transistor 42 result in lower output voltages and reduced power consumption. One way to provide higher resistance values via first transistor 42 is to increase the channel length to width ratio of first transistor 42.

Figure 3:
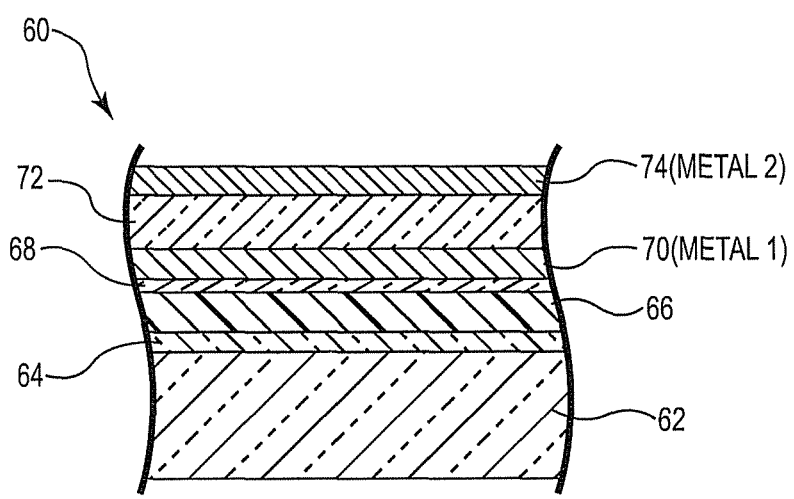
FIG. 3 is a diagram illustrating one example of the layers in a semiconductor chip.

FIG. 3 is a diagram illustrating one example of the layers in a semiconductor chip 60. In one example, semiconductor chip 60 includes transistors, such as MOSFET 20 of FIG. 1. In one example, semiconductor chip 60 includes ratioed logic circuits, such as ratioed logic circuit inverter 40 of FIG. 2. In one example, semiconductor chip 60 is used in an inkjet printhead. In one example, semiconductor chip 60 is an inkjet control chip.

Semiconductor chip 60 includes a semiconductor substrate 62, an oxide layer 64, a polysilicon layer 66, a first dielectric layer 68, a metal 1 layer 70, a second dielectric layer 72, and a metal 2 layer 74. Oxide layer 64 is disposed on substrate 62 between substrate 62 and polysilicon layer 66. First dielectric layer 68 is disposed on polysilicon layer 66 and second dielectric layer 72 is disposed on metal 1 layer 70 to separate metal 1 layer 70 from metal 2 layer 74. Metal 1 layer 70 and metal 2 layer 74 provide gate, drain, and source leads and other connections in semiconductor chip 60. In one example, oxide layer 64 is silicon dioxide (SiO2). In one example, second dielectric layer 72 includes silicon nitride. In one example, second dielectric layer 72 includes silicon carbide. In one example, second dielectric layer 72 includes silicon nitride and silicon carbide.

Figure 4A:
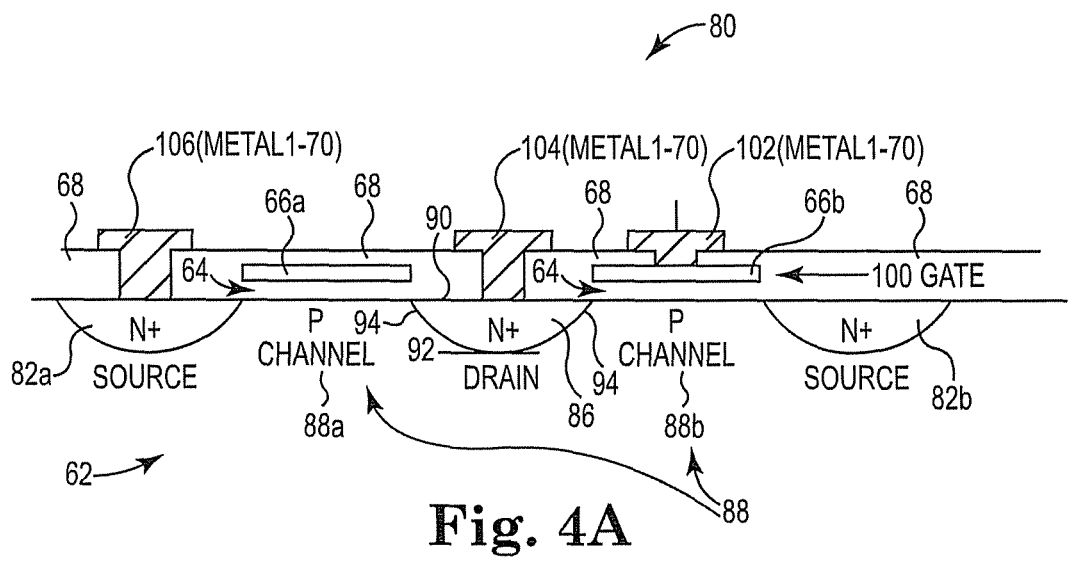
FIG. 4A is a cross-section diagram of a transistor taken along the line A-A of FIG. 4B.
Figure 4B:
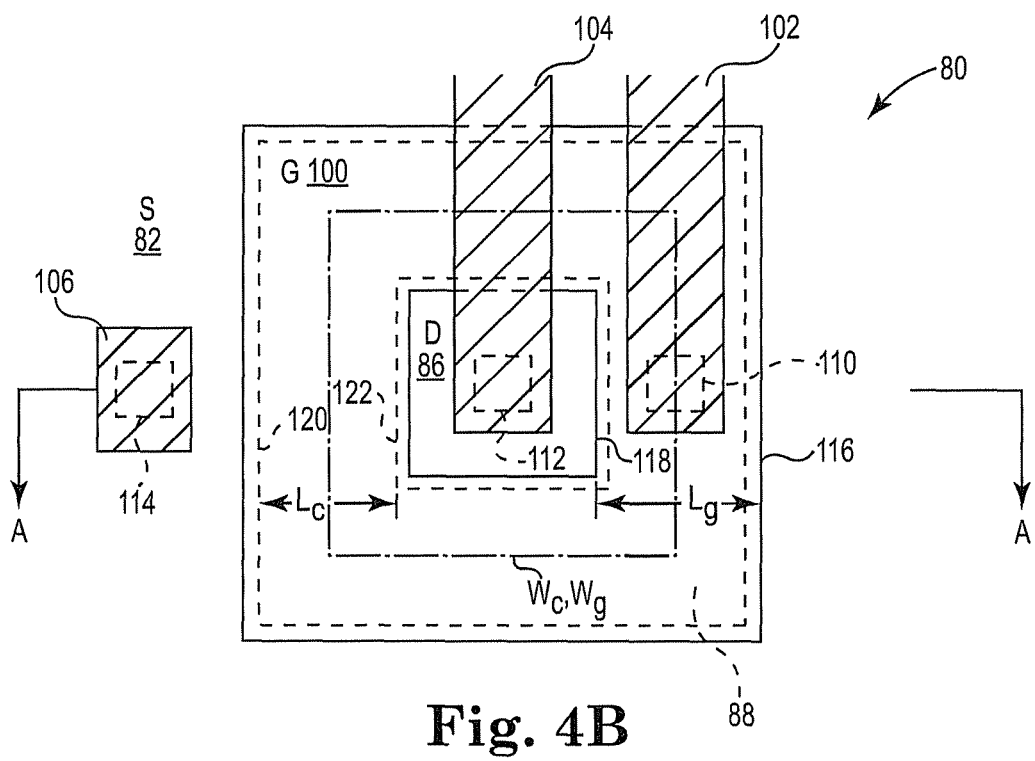
FIG. 4B is a top-view diagram illustrating one example of a transistor.

FIGS. 4A and 4B are diagrams illustrating one example of a transistor 80 that uses the layers of semiconductor chip 60 of FIG. 3.

FIG. 4A is a cross-section diagram of transistor 80 taken along the line A-A of FIG. 4B. In one example, MOSFET 20 of FIG. 1 is similar to transistor 80. In one example, at least one of the first and second transistors 42 and 44 (shown in FIG. 2) is similar to transistor 80. In one example, transistor 80 is used in an inkjet printhead system. In other examples, transistor 80 is created using the layers of a different process.

Transistor 80 includes substrate 62 that has N+ source regions 82a and 82b, an N+ drain region 86, and a p channel 88 including p channel regions 88a and 88b. Drain region 86 includes a top surface 90, a bottom 92, and sides 94 between top surface 90 and bottom 92. Channel 88, including channel regions 88a and 88b, surrounds drain region 86 around the sides 94 of drain region 86. Channel 88 is situated between source region 82a and drain region 86 and between source region 82b and drain region 86. Source regions 82a and 82b are connected and part of one continuous source region 82 that surrounds channel 88.

Channel 88 includes a closed curve structure around drain region 86, where a curve is defined as an object similar to a line, but not required to be straight, which entails that a line is a special case of a curve, namely a curve with null curvature. Also, a closed curve is defined as a curve that joins up and has no endpoints. Channel 88, including channel regions 88a and 88b, is square. In one example, channel 88, including channel regions 88a and 88b, is rectangular and not square. In one example, channel 88, including channel regions 88a and 88b, has at least one rounded interior or exterior corner.

A gate 100 is formed in polysilicon layer 66 and includes polysilicon gate regions 66a and 66b situated over channel regions 88a and 88b, respectively. Dielectric layer 64 is situated between gate 100 and substrate 62. In one example, dielectric layer 64 is a silicon dioxide layer. In one example, gate 100, including gate regions 66a and 66b, is the same shape as channel 88, including channel regions 88a and 88b.

Dielectric layer 68 is disposed over gate 100, drain region 86, and source region 82 including source regions 82a and 82b. A contact mask is used to create vias or holes in dielectric layer 68. The holes are contact holes for gate region 66b, drain region 86, and source region 82a. Metal 1 layer 70 is disposed on dielectric layer 68 and etched to form gate lead 102, drain lead 104, and source lead 106. Gate lead 102 contacts gate region 66b through the hole in dielectric layer 68, drain lead 104 contacts drain region 86 through the hole in dielectric layer 68, and source lead 106 contacts source region 82a through the hole in dielectric layer 68.

Gate 100, including gate regions 66a and 66b, includes a closed curve structure, where a curve is defined as an object similar to a line, but not required to be straight, which entails that a line is a special case of a curve, namely a curve with null curvature. Also, a closed curve is defined as a curve that joins up and has no endpoints. In one example, gate 100, including gate regions 66a and 66b, is rectangular. In one example, gate 100, including gate regions 66a and 66b, is square. In one example, gate 100, including gate regions 66a and 66b, has at least one rounded interior or exterior corner.

In operation, a voltage is applied to gate lead 102 and gate 100, including gate regions 66a and 66b, to create a conductive path in channel 88 between drain region 86 and source regions 82a and 82b. The distance from drain region 86 to source regions 82 is the channel length Lc. With drain lead 104 and drain region 86 connected to a higher voltage and source lead 106 and source regions 82a and 82b connected to a lower voltage, such as ground, current flows from drain region 86 to source regions 82. A lower voltage at gate lead 102 and gate 100 biases transistor 80 toward the off state, where current does not flow between drain region 86 and source regions 82.

To provide the function of a resistor, drain lead 104 and drain region 86 are electrically coupled to gate lead 102 and gate 100. If a higher voltage is provided at drain lead 104 and gate lead 102 than at source lead 106, current flows from drain region 86 to source regions 82.

FIG. 4B is a top-view diagram illustrating the example of transistor 80. Some of the layers of transistor 80, such as dielectric layer 68, are not shown for clarity in FIG. 4B. As described above, transistor 80 includes gate 100, channel 88, drain region 86, and source region 82. Channel 88 is situated under gate 100 and indicated by dotted lines. Channel 88 surrounds drain region 86 and is situated between drain region 86 and source region 82. Source region 82 surrounds channel 88.

Gate lead 102 is connected to gate 100 through dielectric layer 68 via contact hole 110 (shown in dotted lines). Drain lead 104 is connected to drain region 86 through dielectric layer 68 via contact hole 112 (shown in dotted lines). Source lead 106 is connected to source region 82 through dielectric layer 68 via contact hole 114 (shown in dotted lines).

Gate 100 is a square shaped closed curve structure, which is a special case of a rectangular shaped closed curve structure. Gate 100 includes four sides and four right angle corners on each of the exterior side and the interior side. Gate 100 has a gate length Lg that is the distance from exterior side 116 of gate 100 to interior side 118 of gate 100. Gate 100 has a gate width Wg that is the distance around gate 100 as measured at the midpoint between the interior and exterior sides of gate 100. In one example, gate length Lg is the average gate length as measured at different points along the exterior and interior sides of gate 100. In one example, gate length Lg is an equivalent gate length that is used in circuit simulations. In one example, gate width Wg is the distance around gate 100 as measured at the exterior side of gate 100. In one example, gate width Wg is the distance around gate 100 as measured at the interior side of gate 100. In one example, gate width Wg is an equivalent gate width that is used in circuit simulations. In other examples, gate 100 can be another shape.

Channel 88 is also a square shaped closed curve structure, which is a special case of a rectangular shaped closed curve structure. Channel 88 includes four sides and four right angle corners. Channel 88 has a channel length Lc that is the distance from exterior side 120 of channel 88 to interior side 122 of channel 88. Channel 88 has a channel width Wc that is the distance around channel 88 as measured at the midpoint between the interior and exterior sides of channel 88, where channel width Wc is about the same as gate width Wg. In one example, channel length Lc is the average channel length as measured at different points along the exterior and interior sides of channel 88. In one example, channel length Lc is an equivalent channel length that is used in circuit simulations. In one example, channel width Wc is the distance around channel 88 as measured at the exterior side of channel 88. In one example, channel width Wc is the distance around channel 88 as measured at the interior side of channel 88. In one example, channel width Wc is an equivalent channel width that is used in circuit simulations. In other examples, channel 88 can be another shape.

Substantially all of channel 88 is an active channel region. The length to width ratio of the active channel region of channel 88 is equal to the length to width ratio of channel 88, which is Lc/Wc.

The resistance value of a gate-to-drain connected transistor, such as transistor 80, may be too small for some applications, such as ratioed logic circuits. One way to provide higher resistance values using a transistor is to increase the channel length to channel width ratio of the transistor. Increasing channel length Lc also increases the channel width Wc, which limits the increase in the channel length to width ratio to about a factor of 4.

Figure 5A:
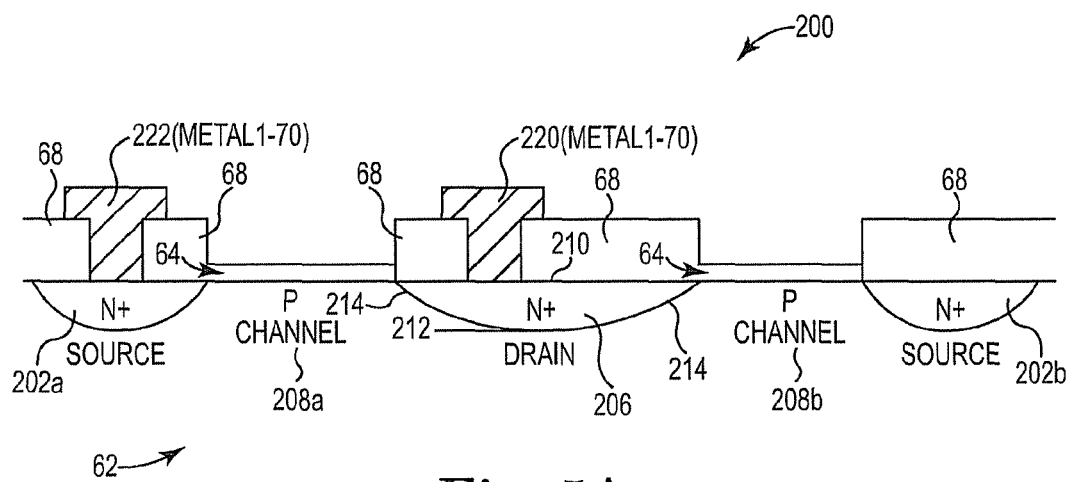
FIG. 5A is a cross-section diagram of a transistor taken along the line B-B of FIG. 5B.
Figure 5B:
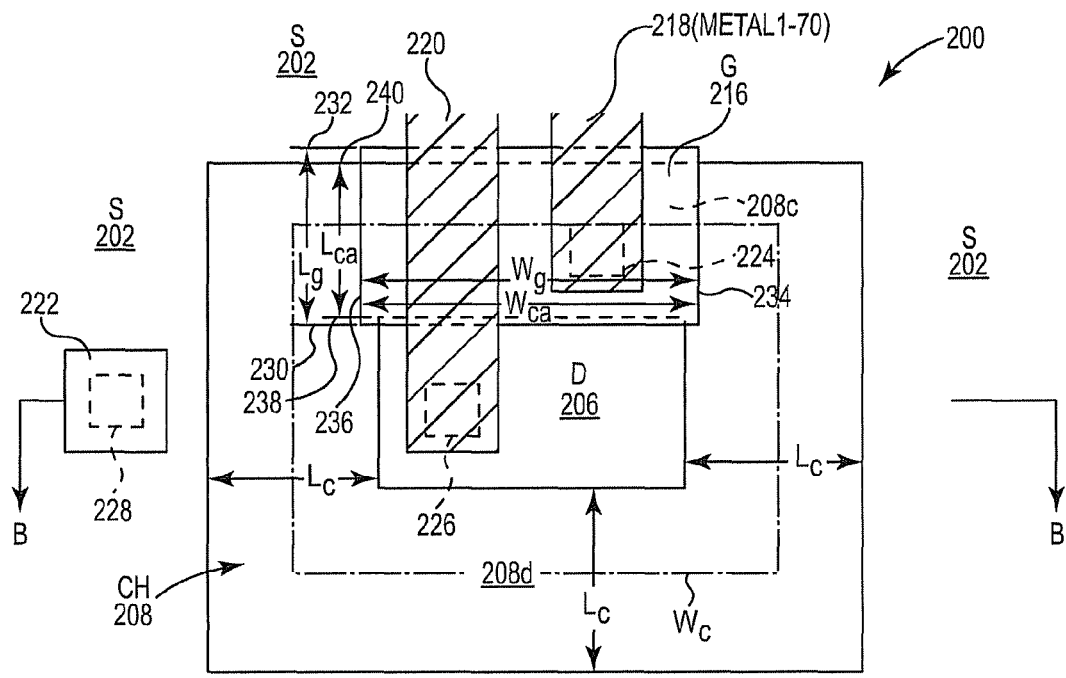
FIG. 5B is a top-view diagram illustrating one example of the transistor of FIG. 5A.

FIGS. 5A and 5B are diagrams illustrating one example of a transistor 200 that increases the resistance value of a gate-to-drain connected transistor by increasing the channel length to width ratio. Using the method of transistor 200, the channel length to width ratio can be increased beyond a factor of 4. Transistor 200 uses the layers of semiconductor chip 60 of FIG. 3.

FIG. 5A is a cross-section diagram of transistor 200 taken along the line B-B of FIG. 5B. In one example, MOSFET 20 of FIG. 1 is similar to transistor 200. In one example, at least one of the first and second transistors 42 and 44 (shown in FIG. 2) is similar to transistor 200. In one example, transistor 200 is used in an inkjet printhead system. In other examples, transistor 200 is created using the layers of a different process.

Transistor 200 includes substrate 62 that has N+ source regions 202a and 202b, an N+ drain region 206, and a p channel 208 including p channel regions 208a and 208b. Drain region 206 includes a top surface 210, a bottom 212, and sides 214 between top surface 210 and bottom 212. Channel 208, including channel regions 208a and 208b, surrounds drain region 206 around the sides 214 of drain region 206. Channel 208 is situated between source region 202a and drain region 206 and between source region 202b and drain region 206. Source regions 202a and 202b are connected and part of one continuous source region 202 that surrounds channel 208.

Channel 208 includes a closed curve structure around drain region 206, where a curve is defined as an object similar to a line, but not required to be straight, which entails that a line is a special case of a curve, namely a curve with null curvature. Also, a closed curve is defined as a curve that joins up and has no endpoints. Channel 208, including channel regions 208a and 208b, is square. In one example, channel 208, including channel regions 208a and 208b, is rectangular and not square. In one example, channel 208, including channel regions 208a and 208b, has at least one rounded interior or exterior corner.

A gate 216 (shown in FIG. 5B) is formed in polysilicon layer 66 over one portion of channel 208. This one portion of channel 208 is referred to as active channel region 208c (indicated with dotted lines under gate 216). Gate 216 is not situated over the other portion of channel 208, which is referred to as the inactive channel region 208d, which includes channel regions 208a and 208b. Dielectric layer 64 is situated between gate 216 and substrate 62 in the active channel region 208c and dielectric layer 64 is situated on substrate 62 in the inactive channel region 208d. In one example, dielectric layer 64 is a silicon dioxide layer.

Dielectric layer 68 is situated over gate 216, drain region 206, and source region 202 including source regions 202a and 202b. A contact mask is used to create vias or holes in dielectric layer 68. These holes are contact holes for gate 216, drain region 206, and source region 202a. Metal 1 layer 70 is disposed on dielectric layer 68 and etched to form gate lead 218, drain lead 220, and source lead 222. Gate lead 218 contacts gate 216 through the hole in dielectric layer 68, drain lead 220 contacts drain region 206 through the hole in dielectric layer 68, and source lead 222 contacts source region 202a through the hole in dielectric layer 68.

Gate 216 is a rectangular shaped gate having a gate length Lg and a gate width Wg. The active channel region 208c under gate 216 has an active channel length Lca and an active channel width Wca, where the gate width Wg and the active channel width Wca are substantially the same. In one example, gate 216 has at least one rounded interior or exterior corner. In other examples, gate 216 is another shape.

In operation, a voltage is applied to gate lead 218 and gate 216 to create a conductive path in active channel region 208c between drain region 206 and source region 202. The distance from drain region 206 to source region 202 in the active channel region 208c is the active channel length Lca. With drain lead 220 and drain region 206 connected to a higher voltage and source lead 222 and source region 202 connected to a lower voltage, such as ground, current flows from drain region 206 to source region 202. A lower voltage at gate lead 218 and gate 216 biases transistor 200 toward the off state, where current does not flow between drain region 206 and source region 202.

To provide the function of a resistor, drain lead 220 and drain region 206 are electrically coupled to gate lead 218 and gate 216. If a higher voltage is provided at drain lead 220 and gate lead 218 than at source lead 222, current flows from drain region 206 to source region 202. In another example, to provide the function of a resistor, drain lead 220 and drain region 206 can be electrically coupled to a high voltage, such as VDD, and gate lead 218 and gate 216 can be electrically coupled to a control output from a previous stage, which can be set to a high voltage.

FIG. 5B is a top-view diagram illustrating the example of transistor 200. Some of the layers of transistor 200, such as dielectric layer 68, are not shown for clarity in FIG. 5B. As described above, transistor 200 includes gate 216, channel 208, drain region 206, and source region 202. Active channel region 208c is situated under gate 216 and indicated by dotted lines. Channel 208 surrounds drain region 206 and is situated between drain region 206 and source region 202. Source region 202 surrounds channel 208.

Gate lead 218 is connected to gate 216 through dielectric layer 68 via contact hole 224 (shown in dotted lines). Drain lead 220 is connected to drain region 206 through dielectric layer 68 via contact hole 226 (shown in dotted lines). Source lead 222 is connected to source region 202 through dielectric layer 68 via contact hole 228 (shown in dotted lines).

Gate 216 is a rectangular shaped gate having four sides and four right angle corners. Gate 216 has a gate length Lg that is the distance from one side 230 to the other side 232. Gate 216 has a gate width Wg that is the distance from one side 234 to the other side 236. In one example, gate length Lg is the average gate length as measured at different points along the sides of gate 216 that are next to drain 206 and source 202. In one example, gate length Lg is an equivalent gate length that is used in circuit simulations. In other examples, gate 216 can be another shape.

Channel 208 includes active channel region 208c and inactive channel region 208d. Active channel region 208c is a rectangular shaped channel having four sides and four right angle corners under gate 216. Active channel region 208c has an active channel length Lca that is the distance from one side 238 to the other side 240. Active channel region 208c has an active channel width Wca that is the distance from one side 234 to the other side 236, where the gate width Wg and the active channel width Wca are substantially the same. In one example, active channel length Lca is the average channel length as measured at different points along the sides of active channel region 208c, which are next to drain 206 and source 202. In one example, active channel length Lca is an equivalent channel length that is used in circuit simulations. In other examples, active channel region 208c can be another shape.

Channel 208, including active channel region 208c and inactive channel region 208d, has a channel length Lc that is the distance from drain 206 to source 202. Channel 208, including active channel region 208c and inactive channel region 208d, has a channel width Wc that is the distance around channel 208 as measured at the midpoint between the interior and exterior sides of channel 208. In one example, channel length Lc is the average channel length as measured at different points along the drain 206 and source 202. In one example, channel length Lc is an equivalent channel length that is used in circuit simulations. In one example, channel width We is the distance around channel 208 as measured at the exterior side of channel 208. In one example, channel width We is the distance around channel 208 as measured at the interior side of channel 208. In one example, channel width We is an equivalent channel width that is used in circuit simulations.

In transistor 200, the active channel length Lca is substantially equal to the channel length Lc, and the active channel width Wca is less than the channel width Wc. Thus, the active channel length to width ratio Lca/Wca is greater than the channel length to width ratio Lc/Wc.

Transistor 200 includes drain 206 surrounded by channel 208 to isolate drain 206 in a process that does not include field oxide. Gate 216 increases the gate length to width ratio and the active channel length to width ratio, which increases the resistance value of a gate-to-drain connected transistor 200. Using this methodology, the active channel length to width ratio can be increased beyond a factor of 4. To reduce the amount of real estate used on a semiconductor chip, the active channel length Lca can be increased, while providing a minimum sized channel length in the inactive channel region 208d.

Figure 6:
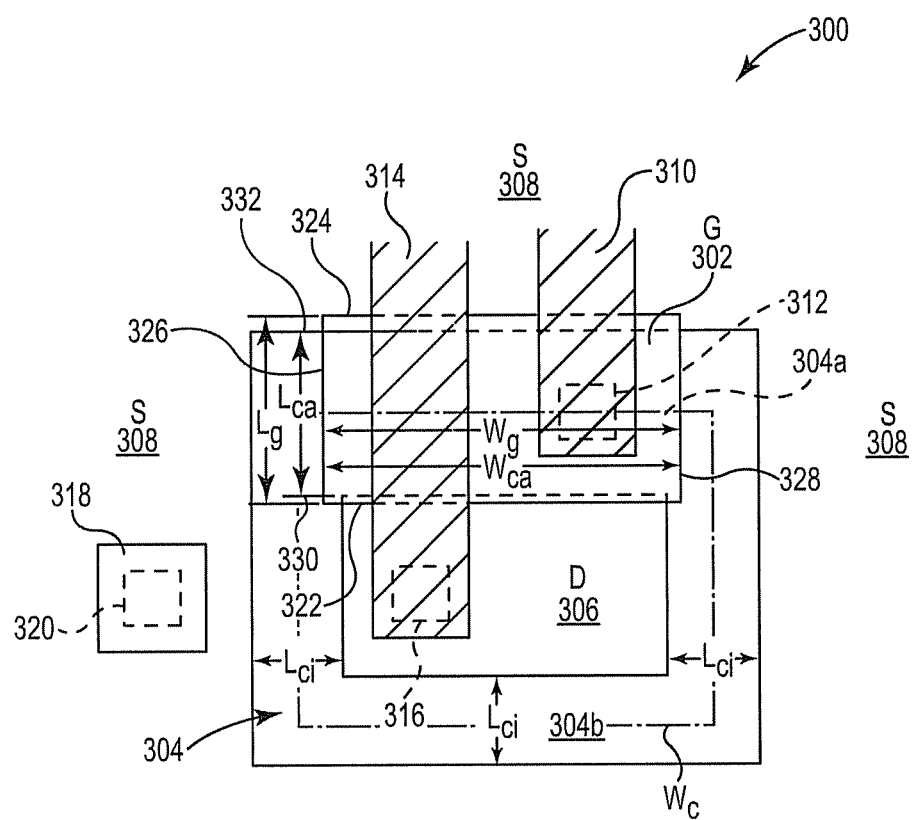
FIG. 6 is a top-view diagram illustrating one example of a transistor that has a longer active channel length and a shorter inactive channel length.

FIG. 6 is a top-view diagram illustrating one example of a transistor 300 that has a longer active channel length Lca and a shorter inactive channel length Lci. The longer active channel length Lca increases the active channel length to width ratio Lca/Wca, which increases the resistance value of a gate-to-drain connected transistor. The shorter inactive channel length Lci reduces the amount of real estate used by transistor 300 on a semiconductor chip. Using this methodology, the active channel length to width ratio can be increased to provide a higher resistance value and the transistor profile can be minimized to reduce size. Transistor 300 is manufactured using the process depicted in FIG. 3, including the layers of semiconductor chip 60 of FIG. 3. Some of these layers, such as dielectric layer 68, are not shown for clarity in FIG. 6. Transistor 300 is similar to transistor 200.

Transistor 300 includes gate 302, channel 304, drain region 306, and source region 308. Active channel region 304a is situated under gate 302 and indicated by dotted lines. Channel 304 surrounds drain region 306 and is situated between drain region 306 and source region 308. Source region 308 surrounds channel 304.

Gate lead 310 is connected to gate 302 through dielectric layer 68 via contact hole 312 (shown in dotted lines). Drain lead 314 is connected to drain region 306 through dielectric layer 68 via contact hole 316 (shown in dotted lines). Source lead 318 is connected to source region 308 through dielectric layer 68 via contact hole 320 (shown in dotted lines).

Gate 302 is a rectangular shaped gate having four sides and four right angle corners. Gate 302 has a gate length Lg that is the distance from one side 322 to the other side 324. Gate 302 has a gate width Wg that is the distance from one side 326 to the other side 328. In one example, gate length Lg is the average gate length as measured at different points along the sides of gate 302, which are next to drain 306 and source 308. In one example, gate length Lg is an equivalent gate length that is used in circuit simulations. In other examples, gate 302 can be another shape.

Channel 304 includes active channel region 304a and inactive channel region 304b. Active channel region 304a is a rectangular shaped channel having four sides and four right angle corners under gate 302. Active channel region 304a has an active channel length Lca that is the distance from one side 330 to the other side 332. Active channel region 304a has an active channel width Wca that is the distance from one side 326 to the other side 328, where the gate width Wg and the active channel width Wca are substantially the same. In one example, active channel length Lca is the average channel length as measured at different points along the sides of active channel region 304a, which are next to drain 306 and source 308. In one example, active channel length Lca is an equivalent channel length that is used in circuit simulations. In other examples, active channel region 304a can be another shape.

Inactive channel region 304b has an inactive channel length Lci that is the distance from drain region 306 to an exterior side of inactive channel region 304b. Inactive channel length Lci is shorter than active channel length Lca to reduce the size of transistor 300 and use less real estate on the semiconductor chip. Active channel length Lca is longer than inactive channel length Lci to increase the active channel length to width ratio Lca/Wca, which increases the resistance value of a gate-to-drain connected transistor 300.

Channel 304, including active channel region 304a and inactive channel region 304b, has a channel width Wc that is the distance around channel 304 as measured at the midpoint between the interior and exterior sides of channel 304. Channel 304, including active channel region 304a and inactive channel region 304b, has a channel length Lc that corresponds to the distance from drain 306 to source 308 and the active channel length Lca and the inactive channel length Lci. In one example, the channel length Lc is equal to (Lca+3Lci)/4. In one example, channel length Lc is the average channel length as measured at different points along the drain 206 and source 202. In one example, channel length Lc is an equivalent channel length that is used in circuit simulations. In one example, channel width Wc is the distance around channel 304 as measured at the exterior side of channel 304. In one example, channel width Wc is the distance around channel 304 as measured at the interior side of channel 304. In one example, channel width Wc is an equivalent channel width that is used in circuit simulations.

In transistor 300, the active channel length Lca is greater than the channel length Lc, and the active channel width Wca is less than the channel width Wc. Thus, the active channel length to width ratio Lca/Wca is greater than the channel length to width ratio Lc/Wc.

Transistor 300 includes drain 306 surrounded by channel 304 to isolate drain 306 in a process that does not include field oxide. Gate 302 increases the gate length to width ratio and the active channel length to width ratio, which increases the resistance value of a gate-to-drain connected transistor 300. Using this methodology, the active channel length to width ratio can be increased and the amount of real estate used on a semiconductor chip minimized.

FIGS. 7A-7F are diagrams illustrating one example of a method of manufacturing a transistor 400. Transistor 400 is similar to transistor 200 of FIGS. 5A and 5B and transistor 300 of FIG. 6.

Figure 7A:
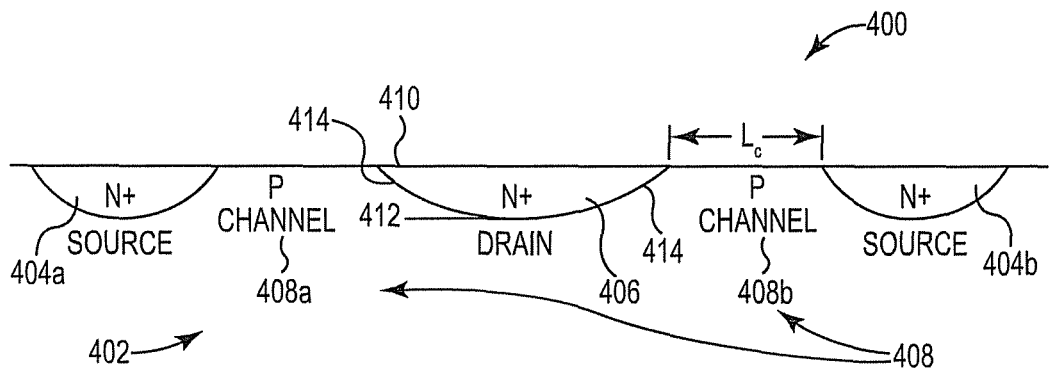
FIG. 7A is a diagram illustrating one example of a substrate that has a source region, a drain region, and a channel.

FIG. 7A is a diagram illustrating one example of a substrate 402 that has N+ source regions 404a and 404b, an N+ drain region 406, and a p channel 408 including p channel regions 408a and 408b. Drain region 406 includes a top surface 410, a bottom 412, and sides 414 between top surface 410 and bottom 412. Channel 408, including channel regions 408a and 408b, surrounds drain region 406 around the sides 414 of drain region 406. Channel 408 is situated between source region 404a and drain region 406 and between source region 404b and drain region 406. Source regions 404a and 404b are connected and part of one continuous source region 404 that surrounds channel 408.

Channel 408 includes a closed curve structure around drain region 406, where a curve is defined as an object similar to a line, but not required to be straight, which entails that a line is a special case of a curve, namely a curve with null curvature. Also, a closed curve is defined as a curve that joins up and has no endpoints. In one example, channel 408 surrounds drain region 406 with a uniform channel length Lc. In one example, channel 408 surrounds drain region 406 with a non-uniform channel length Lc. In one example, channel 408, including channel regions 408a and 408b, is square. In one example, channel 408, including channel regions 408a and 408b, is rectangular and not square. In one example, channel 408, including channel regions 408a and 408b, has at least one rounded interior or exterior corner.

Figure 7B:
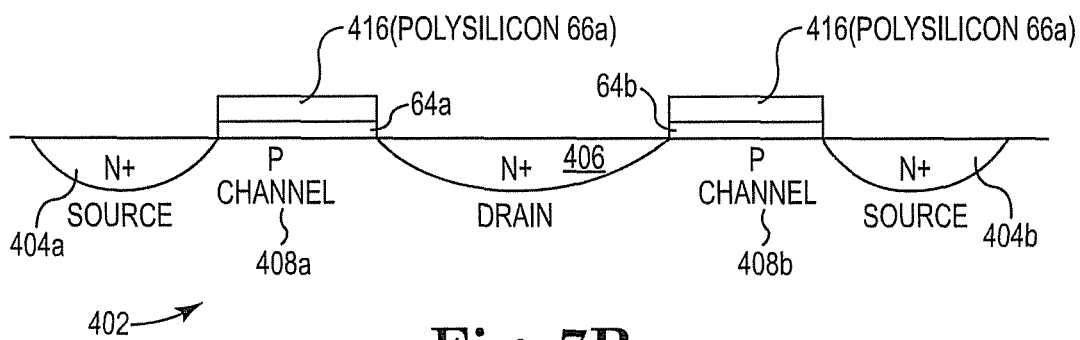
FIG. 7B is a diagram illustrating one example of a gate disposed over the channel.

FIG. 7B is a diagram illustrating one example of a gate 416 disposed over channel 408. Dielectric layer 64 is disposed on substrate 402 and polysilicon layer 66 is disposed on dielectric layer 64. Dielectric layer 64 is patterned to remain on channel 408 and includes dielectric layer 64a on channel region 408a and dielectric layer 64b on channel region 408b. Gate 416 is formed in polysilicon layer 66 and includes polysilicon gate regions 66a and 66b situated over channel regions 408a and 408b, respectively. Dielectric layer 64 is situated between gate 416 and substrate 402. In one example, dielectric layer 64 is a silicon dioxide layer. In one example, gate 416 is the same shape as channel 408.

Figure 7C:
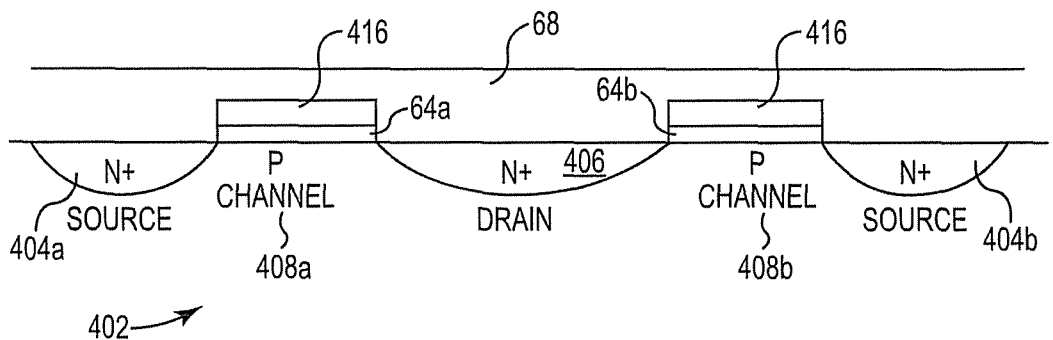
FIG. 7C is a diagram illustrating one example of a second dielectric layer disposed on the gate, drain region, and source region.

FIG. 7C is a diagram illustrating one example of a second dielectric layer 68 disposed on gate 416, drain region 406, and source region 404, including source regions 404a and 404b.

Figure 7D:
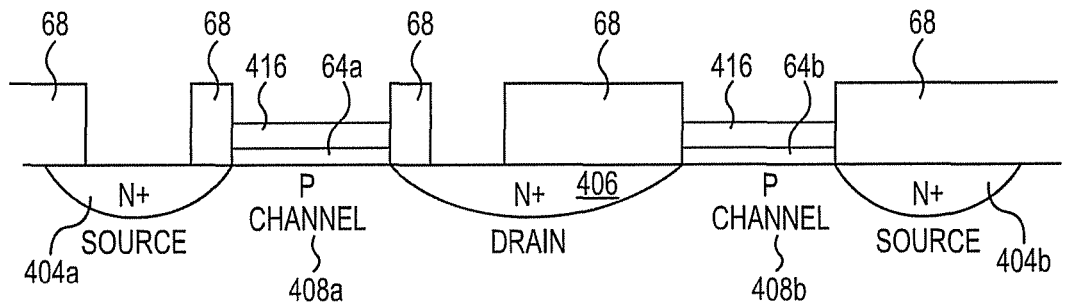
FIG. 7D is a diagram illustrating one example of an etched second dielectric layer.

FIG. 7D is a diagram illustrating one example of etched dielectric layer 68, after etching dielectric layer 68 via a contact mask to create holes in dielectric layer 68. Contact holes are etched in dielectric layer 68 to make contact to gate 416, drain region 406, and source region 404a. The contact hole for gate 416 is etched through dielectric layer 68 over active channel regions, such as active channel region 208c in transistor 200 and active channel region 304a in transistor 300. Dielectric layer 68 is also etched away via the contact mask over portions of gate 416 that are over inactive channel regions, including channel regions 408a and 408b, and inactive channel regions such as inactive channel region 208d in transistor 200 and inactive channel region 304b in transistor 300.

Figure 7E:
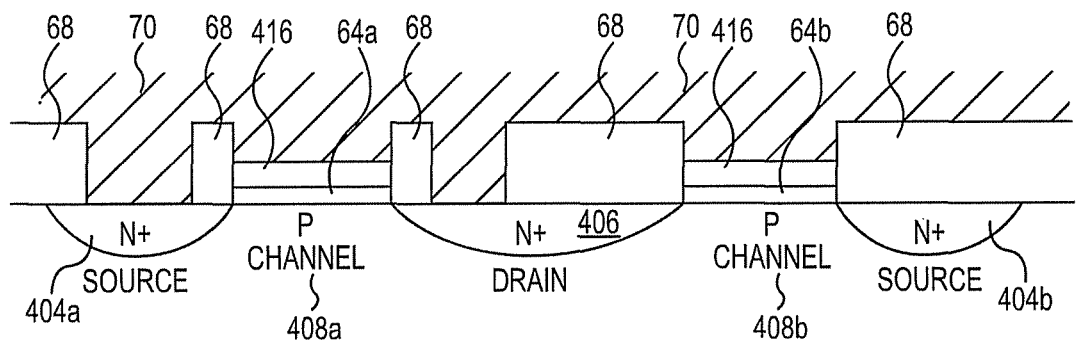
FIG. 7E is a diagram illustrating one example of metal 1 layer disposed on the second dielectric layer, gate, drain region, and source region.

FIG. 7E is a diagram illustrating one example of metal 1 layer 70 disposed on dielectric layer 68, gate 416, drain region 406, and source region 404. Metal 1 layer 70 contacts gate 416 through the gate contact hole and over the inactive channel region. Metal 1 layer 70 contacts drain region 406 through the drain contact hole and source region 404 through the source contact hole over source region 404a.

Figure 7F:
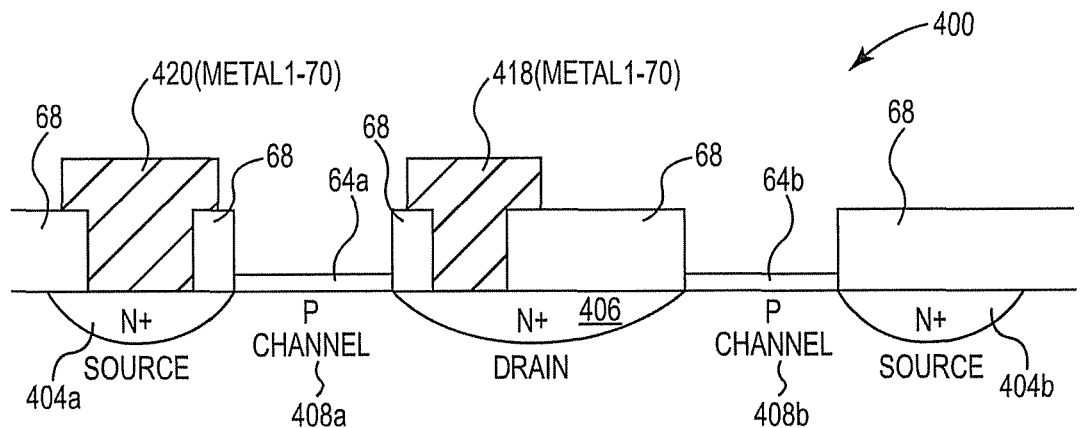
FIG. 7F is a diagram illustrating one example of the transistor after etching the metal 1 layer to form a gate lead, drain lead, and source lead.

FIG. 7F is a diagram illustrating one example of transistor 400 after etching metal 1 layer 70 to form a gate lead (not shown), drain lead 418, and source lead 420. Metal 1 layer 70 is etched away in areas that are unprotected in the photolithographic process, including over the active channel region, down to dielectric layer 68. Metal 1 layer and gate 416 are etched away over the inactive channel region down to dielectric layer 64, including dielectric layers 64a and 64b.

The gate lead contacts gate 416 through the contact hole in dielectric layer 68 over the active channel region of transistor 400. Drain lead 418 contacts drain region 406 through the contact hole in dielectric layer 68, and source lead 420 contacts source region 404 through the contact hole in dielectric layer 68 over source region 404a.

Etching away metal 1 layer 70 and a portion of gate 416 creates the active channel region and the inactive channel region in transistor 400, where the active channel region has an active channel region length to width ratio that is greater than the channel length to width ratio of transistor 400 prior to etching away metal 1 layer 70 and a portion of gate 416. In one example, etching away metal 1 layer 70 and a portion of gate 416 creates an active channel region and an inactive channel region, which provides a longer channel length in the active channel region and a shorter channel length in the inactive channel region.

Transistor 400 includes drain 406 surrounded by channel 408 to isolate drain 406 in a process that does not include field oxide. Gate 416 is etched to increase the gate length to width ratio and the active channel length to width ratio, which increases the resistance value of a gate-to-drain connected transistor 400. Using this methodology, the active channel length to width ratio can be increased and the amount of real estate used on a semiconductor chip minimized.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A device comprising:
   a drain;
   a channel that surrounds the drain and has a channel length to width ratio; and
   a gate situated over the channel to provide an active channel region that has an active channel region length to width ratio that is greater than the channel length to width ratio.

2. The device of claim 1, wherein the channel has a uniform channel length around the drain.

3. The device of claim 1, wherein the channel has a non-uniform channel length around the drain.

4. The device of claim 1, wherein the channel includes an inactive channel region and the channel has a longer channel length in the active channel region and a shorter channel length in the inactive channel region.

5. The device of claim 1, comprising a dielectric layer on the gate and metal over the gate and on the dielectric layer, wherein the metal includes a gate lead that contacts the gate through the dielectric layer and a drain lead that contacts the drain through the dielectric layer.

6. The device of claim 1, comprising a silicon dioxide layer between the channel and the gate, and a source that surrounds the channel.

7. A semiconductor device comprising:
   a drain;
   a channel that surrounds the drain and has an active channel region that has an active channel region length, and an inactive channel region that has an inactive channel region length that is less than the active channel region length; and
   a gate situated over the active channel region.

8. The semiconductor device of claim 7, wherein the channel has a channel length to width ratio and the gate has a gate length to width ratio that is greater than the channel length to width ratio.

9. The semiconductor device of claim 7, comprising a dielectric layer on the gate and metal over the gate and on the dielectric layer, wherein the metal includes a gate lead that contacts the gate through the dielectric layer and a drain lead that contacts the drain through the dielectric layer.

10. The semiconductor device of claim 7, wherein the gate is electrically connected to the drain to provide a resistor pull-up in a ratioed logic circuit.

11. A method of manufacturing a device, comprising:
    surrounding a drain with a channel having a channel length to width ratio;
    disposing a gate over the channel;
    disposing a dielectric layer on the gate and the drain;
    etching the dielectric layer to provide a drain contact and to etch away the dielectric layer on a first portion of the gate to provide a gate contact, and on a second portion of the gate;
    disposing metal on the device to contact the gate through the gate contact and to contact the drain through the drain contact; and
    etching the metal to provide a gate lead and a drain lead and to etch away the second portion of the gate and the metal on the second portion of the gate, wherein etching the metal etches away the second portion of the gate to provide an active channel region length to width ratio that is greater than the channel length to channel width ratio.

12. The method of claim 11, wherein etching the metal comprises:
    etching away the second portion of the gate to provide an active channel region and an inactive channel region.

13. The method of claim 11, wherein etching the metal comprises:
    etching away the second portion of the gate to provide an active channel region and an inactive channel region, which provides a longer channel length in the active channel region and a shorter channel length in the inactive channel region.

14. The method of claim 11, wherein surrounding a drain with a channel comprises:
    surrounding the drain with a channel of uniform channel length.

* * * * *